(12) United States Patent
Suzuki et al.

(10) Patent No.: US 7,908,747 B2
(45) Date of Patent: Mar. 22, 2011

(54) METHOD FOR ASSEMBLING TESTING EQUIPMENT FOR SEMICONDUCTOR SUBSTRATE

(75) Inventors: Takeyuki Suzuki, Yokohama (JP); Ryo Ujike, Tokyo (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 255 days.

(21) Appl. No.: 11/407,267

(22) Filed: Apr. 20, 2006

(65) Prior Publication Data

US 2006/0240581 A1   Oct. 26, 2006

(30) Foreign Application Priority Data

Apr. 20, 2005   (JP) .................. 2005-122840

(51) Int. Cl.
*H01R 43/00*    (2006.01)
*H01R 43/16*    (2006.01)
*H05K 3/10*     (2006.01)

(52) U.S. Cl. .................. 29/884; 29/874; 29/846

(58) Field of Classification Search ............. 29/592.1, 29/874–876, 882, 846–852; 257/48, 797, 257/E23.001, E23.179; 438/14, 401, 462; 324/754, 757, 758, 765
See application file for complete search history.

(56) References Cited

U.S. PATENT DOCUMENTS

| | | | | |
|---|---|---|---|---|
| 3,873,429 A | * | 3/1975 | Brown | 205/126 |
| 5,789,930 A | * | 8/1998 | Isaacs et al. | 324/754 |
| 6,015,520 A | * | 1/2000 | Appelt et al. | 264/104 |
| 6,133,072 A | * | 10/2000 | Fjelstad | 438/128 |
| 6,835,318 B2 | * | 12/2004 | Suzuki et al. | 216/13 |
| 2002/0029486 A1 | * | 3/2002 | Uchiyama et al. | 33/645 |
| 2002/0118029 A1 | * | 8/2002 | Yamasaka | 324/754 |

FOREIGN PATENT DOCUMENTS

| | | | |
|---|---|---|---|
| JP | 03-192741 A | | 8/1991 |
| JP | 04-249333 A | | 9/1992 |
| JP | 05-267802 A | | 10/1993 |
| JP | 08125396 | * | 10/1994 |
| JP | 07-211750 A | | 8/1995 |
| JP | 08-125396 A | | 5/1996 |
| JP | H08-125396 | * | 5/1996 |
| JP | 10-065291 A | | 3/1998 |
| JP | 10-270815 | | 10/1998 |
| JP | 11-004082 A | | 1/1999 |
| JP | 11-142435 | | 5/1999 |
| JP | 2000-165047 A | | 6/2000 |
| JP | 2000-188483 | | 7/2000 |
| JP | 2001-034324 | | 2/2001 |
| KR | 97-032310 A | | 6/1997 |

* cited by examiner

*Primary Examiner* — A. Dexter Tugbang
*Assistant Examiner* — David P Angwin
(74) *Attorney, Agent, or Firm* — Finnegan, Henderson, Farabow, Garrett & Dunner, LLP

(57) ABSTRACT

Upon an assembly of a probe head unit, the relative positions of the probe pins 28*ai* to those of the electrode group 24E in the pitch-changing substrate 24 are determined by making the positions of the through-holes 26A, 26B, 26C and 26D in the contact block 26 to coincide with the positioning marks 24MA, 24MB, 24MC and 24MD in the pitch-changing substrate 24.

10 Claims, 20 Drawing Sheets

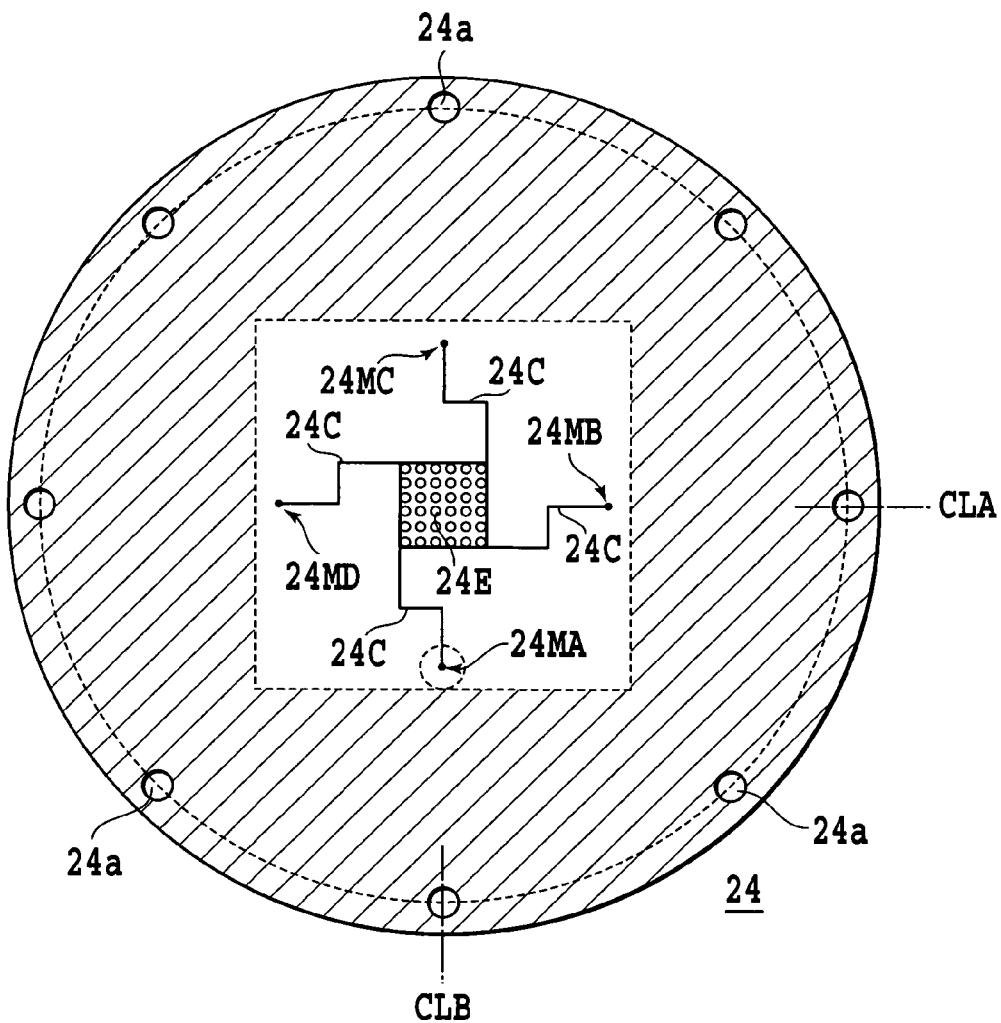
FIG.8A
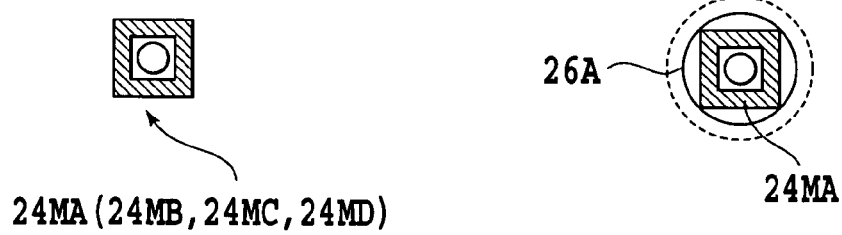
FIG.8B  FIG.8C

METHOD FOR ASSEMBLING TESTING EQUIPMENT FOR SEMICONDUCTOR SUBSTRATE

This application claims priority from Japanese Patent Application Laid-open No. 2005-122840 filed Apr. 20, 2005 which is hereby incorporated by reference herein.

BACKGROUND OF THE INVENTION

1. Field of the Invention

The present invention relates to a method for assembling a testing equipment for a semiconductor substrate.

2. Description of the Related Art

A semiconductor substrate, such as a silicon wafer, is tested by a testing equipment prior to a dicing process regarding a circuit pattern formed in the respective area thereof. Such a testing equipment is provided with a probe head unit movable to each of the areas, having probe pins to be in contact with the respective circuit pattern for delivering or receiving test signals thereto or therefrom as disclosed, for example, in Japanese Patent Application Laid-open No. 2000-321303.

As shown in FIG. 20, the probe head unit includes a reinforcement frame member 2 for reinforcing the rigidity of a printed wiring board 6 described later, a reinforcement frame member 4 disposed inside of the reinforcement frame member 2 for reinforcing the rigidity of the printed wiring board 6 in cooperation with the reinforcement frame member 2, the printed wiring board 6 disposed on one side surfaces of the reinforcement frame members 2 and 4 as a test board for delivering test signals or others to the respective circuit patterns of a semiconductor substrate to be tested, a pitch-changing substrate 8 for electrically connecting the printed wiring board 6 to a contact block 12 described later, and a contact block 12 disposed on the pitch-changing substrate 8, having a plurality of probe pins 14$ai$ ($i$=1 to n, n is a positive integer) for electrically connecting the pitch-changing substrate 8 to the respective circuit patterns of the semiconductor substrate (not shown) to be tested, and a cover member 10 for fixing the contact block 12 to the reinforcement frame members 2 and 4 via the printed wiring board 6 while bringing the contact block 12 into contact the pitch-changing substrate 8.

In FIG. 20, the reinforcement frame member 2 has an opening 2$a$ at a center thereof. The reinforcement frame member 4 is inserted into the opening 2$a$ at a predetermined gap between both the members. A plurality of female-screw holes are formed on the periphery of the opening 2$a$ along the circumference thereof, and machine screws Ba for fixing the cover member 10 are threaded therein and threaded-engagement therewith. The reinforcement frame member 4 has a plurality of female-screw holes along the circumference thereof. Machine screws Bb are threaded into each female-screw holes and threaded-engagement therewith so that the contact block 12 is fixed to the printed wiring board 6 via the pitch-changing substrate 8.

In a central region of the printed wiring board 6, there is a group of electrodes formed in correspondence to connection terminals of the pitch-changing substrate 8 to be electrically connected thereto. The electrode group is connected via the probe head unit to a tester for testing electrical characteristics of circuit patterns in the semiconductor substrate. The printed wiring board 6 also has through-holes through which pass the above-mentioned machine screws Ba and Bb respectively.

In a central region of the pitch-changing substrate 8, there is formed a group of electrodes electrically connected to one ends of the probe pins 14$ai$ of the contact block 12. The electrodes in the group are formed in correspondence to a relatively narrow pitch of the probe pins 14$ai$. Also, the electrode group are connected, via a predetermined conductive patterns, to connection terminals formed on a rear surface of the above-mentioned printed wiring board 6 in correspondence to the group of the electrodes. A pitch of the connection terminal group is larger than the pitch of the electrode group. The pitch-changing substrate 8 has holes through which pass the machine screws Bb. The pitch-changing substrate 8 is positioned to the printed wiring board 6 by inserting the machine screws Bb coaxially into the holes in the pitch-changing substrate 8 and the printed wiring board 6.

The contact block 12 has a plurality of probe pins 14$ai$ in correspondence to the group of electrodes in the pitch-changing substrate 8. There are through-holes through which pass the machine screws Bb on the outer peripheral edge of the contact block 12. A plurality of recesses are provided along the circumferential direction in the contact block 12 between the plurality of probe pins 14$ai$ and the through-holes through which pass the machine screws Bb, the recesses for accommodating one ends of coil springs CS for biasing the contact block 12 toward the pitch-changing substrate 8. The other ends of the coil springs CS are accommodated in recesses formed in the inner circumference of the cover member 10.

The outer periphery of the contact block 12 is engaged with an inner periphery portion 10$b$ described later of the cover member 10 at a predetermined gap therefrom. A central convex of the contact block 12 is engaged with the inner circumferential portion defining a larger opening 10$a$ of the cover member 10 at a predetermined gap therefrom.

After the passable positioning of the probe pins 14$ai$ in the contact block 12 to the electrode group of the pitch-changing substrate 8 has been finished by inserting the machine screws Bb into the through-holes in the contact block 12 and the pitch-changing substrate 8, the current is actually sent between the probe pins 14$ai$ in the contact block 12 and the electrode group in the pitch-changing substrate 8. When the conductive state has not been confirmed thereby, the mutual positioning is adjusted again.

The cover member 10 has the opening 10$a$ at a central region thereof and also has a larger opening 10$b$ to be engaged with the outer circumference of the contact block 12. The smaller opening 10$a$ communicates with the larger opening 10$b$. Through-holes into which are inserted the machine screws Ba, Bb are formed around the opening 10$a$ in the circumferential direction.

In such a structure, upon assembling the probe head unit, first the reinforcement frame member 4 is disposed in the opening 2$a$ of the reinforcement frame member 2, then the printed wiring board 6 is laid on the reinforcement frame member 2, after which the pitch-changing substrate 8 and the contact block 12 are laid on the printed wiring board 6. Subsequently, the cover member 10 is laid on the contact block 12, and thereafter, the machine screws Ba, Bb are inserted into the respective holes and screwed into the female-screw holes in the reinforcement frame members 2 and 4. Thus, the temporary assembly of the probe head unit is finished. Then, it is confirmed whether or not the positioning of the probe pins 14$ai$ in the contact block 12 relative to the electrode group in the pitch-changing substrate 8 as well as that of the group of connection terminals in the pitch-changing substrate 8 relative to the terminal group in the printed wiring board 6 are proper, by the conductive state as a result of supplying predetermined signals to the printed wiring board 6, and if it is confirmed that the positioning is proper, the machine screws Ba, Bb are more tightly retightened to a complete degree.

SUMMARY OF THE INVENTION

When the above-mentioned probe head unit is assembled, it is necessary to carry out the positioning of the electrode group in the pitch-changing substrate 8 to the probe pins 14ai in the contact block 12 simultaneously with the positioning of the connection terminals in the pitch-changing substrate 8 to the terminals in the printed wiring board 6. When the contact block 12 is placed on the pitch-changing substrate 8, however, the electrode group of the pitch-changing substrate 8 is concealed by the contact block 12. Accordingly, the relative positions of the probe pins 14ai to the electrode group in the pitch changing substrate 8 cannot be confirmed, whereby the positioning accuracy solely depends on the fitting accuracy between the machine screws Bb and the through-holes. As a result, there may be a risk in that the adjustment of the positioning is many a time repeated to result in enormous amounts of the time required for the assembly.

In view of the above problems, an object of the present invention is to provide a method for assembling a testing equipment for a semiconductor substrate which is able to easily and accurately adjust the relative position of the probe pin in the contact block to the pitch-changing substrate.

To achieve the above-mentioned object, the inventive method for assembling a testing equipment for a semiconductor substrate comprises the steps of: overlaying a contact block having a group of connection terminals to be electrically connected to circuit patterns in a semiconductor substrate and a mark detection hole having a predetermined positional relationship to the connection terminal group on a changing substrate having a group of electrodes to be electrically connected to the connection terminal group; making a positioning mark formed in the changing substrate to coincide with the mark detection hole, the positioning mark being formed in correspondence to the mark detection hole in the disposed contact block to have a predetermined positional relationship to the position of the electrode group; and coupling the contact block and the changing substrate which the positioning mark and the mark detection hole coincide with each other to a printed wiring board for supplying test signals to the electrode group.

Also, the inventive method for assembling a testing equipment for a semiconductor substrate comprises the steps of: disposing a group of connection terminals to be electrically connected to circuit patterns in a semiconductor substrate, a changing substrate having a group of electrodes to be electrically connected to the connection terminal group, and a dowel member arranged on the changing substrate on a printed wiring board for supplying test signals to the electrode group via the changing substrate; coupling the changing substrate to the printed wiring board; overlaying, on the dowel member, a contact block having mark detection hole having a predetermined positional relationship to positions of the group of connection terminals; making a positioning mark in the changing substrate to coincide with the mark detection hole in the contact block, the positioning mark being formed in correspondence to the mark detection hole in the disposed contact block to have a predetermined positional relationship to a position of the electrode group; and coupling the contact block to the dowel member.

Further, the inventive method for assembling a testing equipment for a semiconductor substrate comprises the steps of: overlaying, with each other, a group of connection terminals to be electrically connected to circuit patterns in a semiconductor substrate, a changing substrate having an electrode group to be electrically connected to the connection terminal group, a dowel member disposed on the changing substrate, and a contact block on the dowel member, having mark detection hole having a predetermined positional relationship to a position of the connection terminal group; making the positioning mark in the changing substrate to coincide with the mark detection hole; the positioning mark being formed in correspondence to the mark detection hole in the disposed contact block to have a predetermined positional relationship to the position of the electrode group; coupling the contact block to the dowel member; disposing the contact block and the changing substrate which the positioning mark and the mark detection hole coincide with each other on a printed wiring board for supplying test signals to the electrode group; and coupling the contact block and changing substrate to the printed wiring board.

As apparent from the above-mentioned explanation, according to the inventive method for assembling a testing equipment for a semiconductor substrate, since the step for making the positioning mark in the changing substrate to coincide with the mark detection hole in the contact block, which the positioning mark are formed in correspondence with the mark detection hole in the contact block to have a predetermined positional relationship to a position of the electrode group is comprised, it is possible to easily and accurately adjust the relative position of the probe pin in the contact block to the changing substrate.

The above and other objects, effects, features and advantages of the present invention will become more apparent from the following description of embodiments thereof taken in conjunction with the accompanying drawings.

BRIEF DESCRIPTION OF THE DRAWINGS

FIG. 8A is a plan view of a pitch-changing substrate used in the example shown in FIG. 1, FIG. 8B is an enlarged view showing a positioning mark in the pitch-changing substrate and FIG. 8C illustrates a state wherein the positioning mark generally coincides with a hole;

DETAILED DESCRIPTION OF THE PREFERRED EMBODIMENTS

Figure 2:
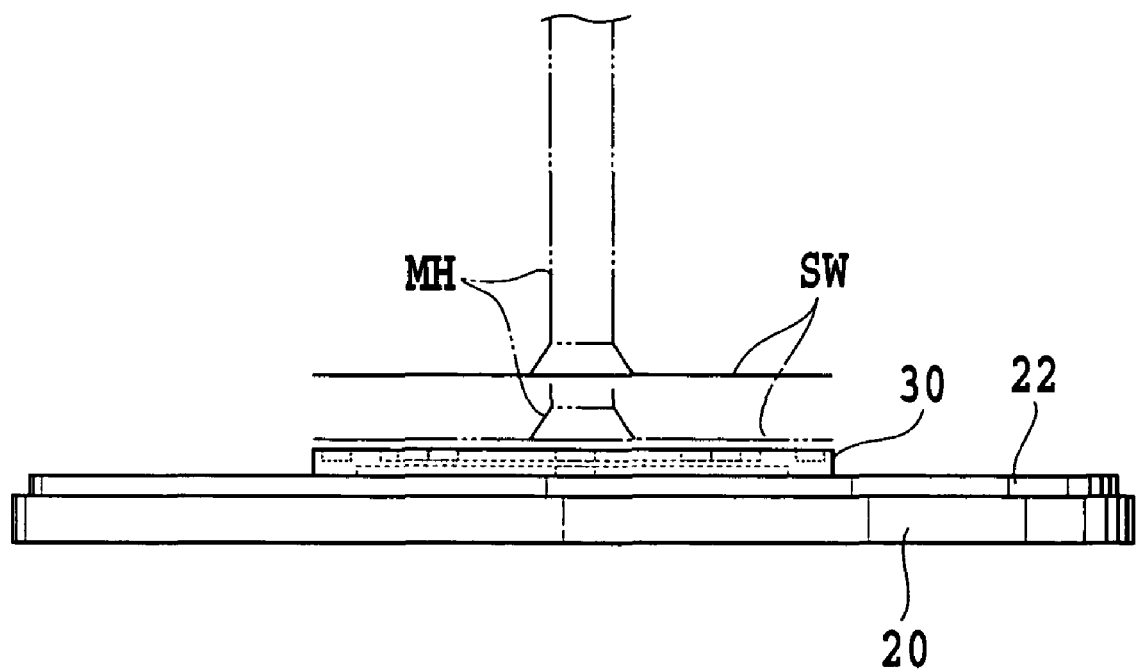
FIG. 2 is a diagrammatic illustration of an appearance of the probe head unit to which is applied the first embodiment of the method for assembling a testing equipment for a semiconductor substrate in accordance with the present invention, together with the semiconductor substrate.

FIG. 2 schematically illustrates an overall structure of a probe head unit to which is applied a first embodiment of the method for assembling a testing equipment for a semiconductor substrate in accordance with the present invention.

Figure 1:
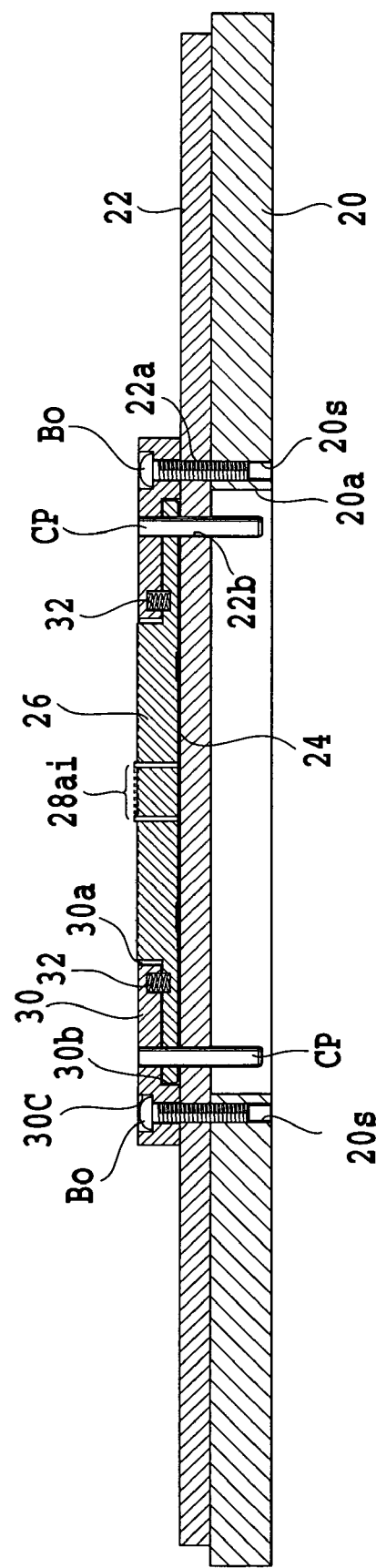
FIG. 1 is a schematic cross-sectional view of an overall structure of a probe head unit to which is applied a first embodiment of the method for assembling a testing equipment for a semiconductor substrate in accordance with the present invention.

In FIG. 2, the probe head unit for the electric connection to a semiconductor substrate SW includes a reinforcement frame member 20 for reinforcing the rigidity of a printed wiring board 22, and a printed wiring board 22 as a test board for supplying test signals or others to circuit patterns in the tested semiconductor substrate SW disposed on one surface of the reinforcement frame member 20. As shown in FIG. 1, the probe head unit further includes a pitch-changing substrate 24 for the mutual electric connection between the printed wiring board 22 and a contact block 26 described later 26, the contact block 26 having a plurality of probe pins $28ai$ (i=1 to n, n is a positive integer) for the electric connection between the circuit patterns in the semiconductor substrate to be tested and the pitch-changing substrate 24, and a cover member 30 for fixing the contact block 26 to the reinforcement frame member 20 via the printed wiring board 22 while bringing the contact block 26 into contact with the pitch-changing substrate 24.

The semiconductor substrate SW such as a silicon wafer to be disposed on the probe head unit is held by a handler MH moving along a passage in accordance with a predetermined program and subsequently supplied from a predetermined stacker to the probe head unit fixed on a table. The circuit patterns formed in the respective areas in the held silicon wafer are subsequently made to be closer to the probe pins $28ai$ of the probe head unit or away therefrom by the handler MH operated in accordance with a predetermined program.

In FIG. 1, the reinforcement frame member 20 has a central opening 20a therein. Into the opening 20a, one ends of positioning pins CP are projected. On the periphery of the opening 20a, a plurality of female-screw holes 20S are formed along the circumference of the opening, threaded-engagement with machine screws Bo for fixing the cover member 30.

Figure 3:
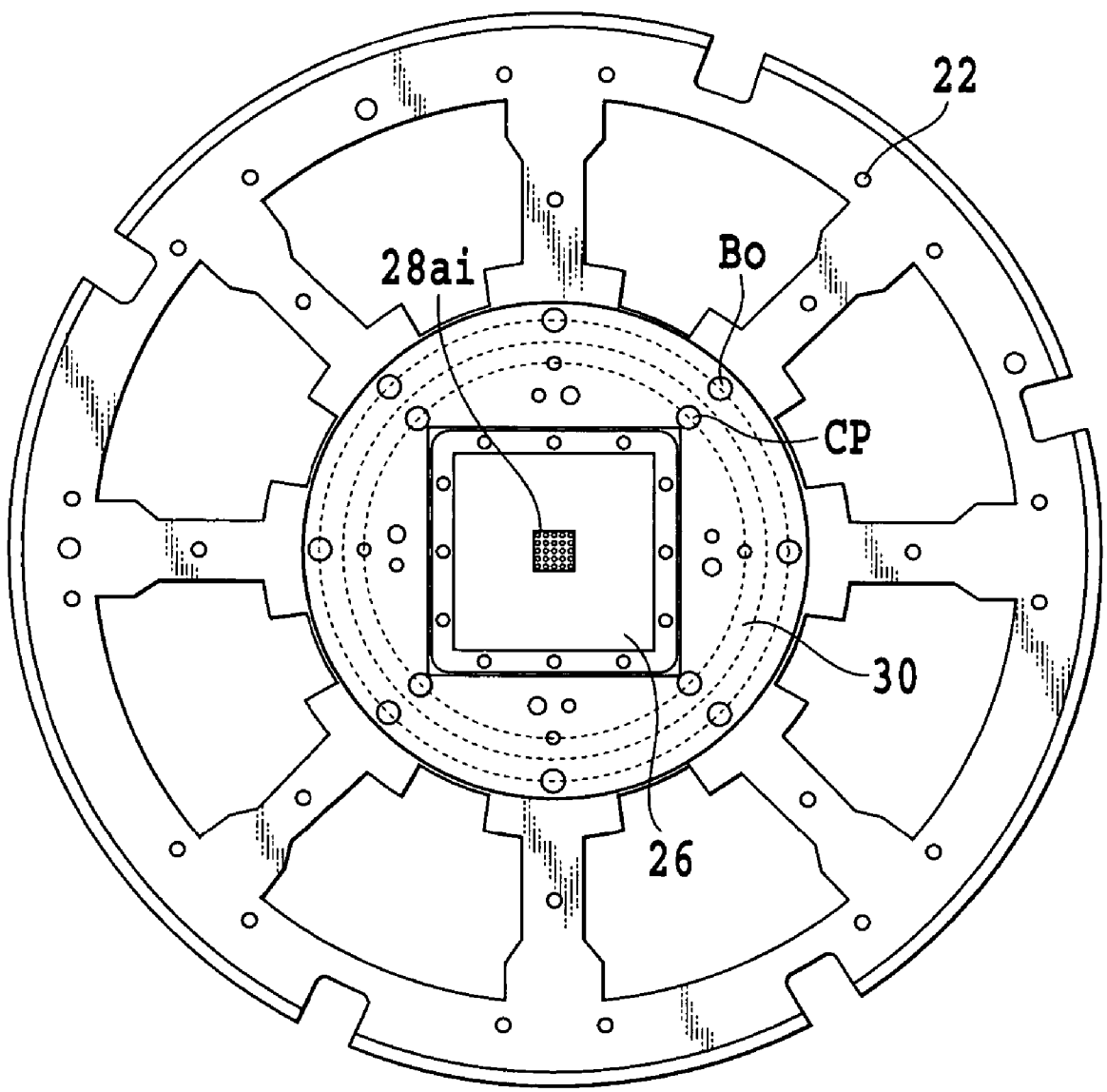
FIG. 3 is a plan view of the example shown in FIG. 2.

At a center of a disk-like printed wiring board 22, a group of electrodes is formed in correspondence to connection terminals of the pitch-changing substrate 24 to be electrically connected thereto. The electrode group is connected to a tester (not shown) for testing the electrical characteristics of the circuit patterns of the semiconductor substrate via the probe head unit. Also, as shown in FIG. 3, the printed wiring board 22 has a plurality of holes 22a, 22b uniformly arranged in the circumferential direction, through which pass the above-mentioned positioning pins CP and machine screws Bo.

As shown in FIG. 8A in an enlarged manner, the pitch-changing substrate 24 has a plurality of holes 24a through which pass the positioning pins CP, uniformly arranged on a common circumference. As shown in an enlarged manner in FIG. 8A, there is a group of electrodes 24E to be electrically connected to one ends of the probe pins $28ai$ in the contact block 26 in a center area on one surface layer of the pitch-changing substrate 24. This electrode group 24E is formed in correspondence to a relatively narrow pitch of the probe pins $28ai$. The electrode group 24E is connected to connection electrode pads (not shown) formed on the other surface layer (on the back side opposed to the printed wiring board 22) via a group of conductor patterns. The connection electrode pads are formed, for example, in correspondence to the above-mentioned electrode group in the printed wiring board 22 in the circumferential direction. A pitch between the respective connection electrode pads is larger than that of the electrode group 24E.

On the periphery of the electrodes in the respective corners of the electrode group 24E, there are positioning marks 24MA, 24MB, 24MC and 24MD electrically connected by conductor patterns 24C, respectively. The positioning patterns 24MA, 24MB, 24MC and 24MD are used for positioning the probe pins $28ai$ in the contact block 26 to the electrode group 24E.

The positioning marks 24MA and 24MC are opposed to each other on a center line CLB of the pitch-changing substrate 24, while the positioning mark 24MB and 24MD are opposed to each other on a center line CLA of the pitch-changing substrate 24.

Since the positioning marks 24MA, 24MB, 24MC and 24MD are one and the same each other, the explanation will be made solely on the positioning mark 24MA and eliminate on the other marks.

As shown in FIG. 8B, the positioning mark 24MA is formed together with the conductor pattern 24C to be a generally 0.5 mm square frame. A width of an edge of the positioning mark 24MA is approximately 0.1 mm. In this regard, the reason for determining the outer dimension of the positioning mark 24MA to approximately 0.5 mm is that a diameter of holes 26A to 26D used for positioning the contact block 26 is approximately 0.6 mm. That is, the outer dimension of the positioning mark 24MA is not be limited to 0.5 mm but may be changed in accordance with diameters of the hole used for positioning the contact block 26.

A distance between a center of the respective hole 24a in the pitch-changing substrate 24 and a center of a rear surface side connection pad (not shown) is determined to be equal to a distance between a center of the printed wiring board 22 and the respective hole 22b thereof. Thereby, the pitch-changing substrate 24 is positioned to the printed wiring board 22 by coaxially inserting the respective positioning pin CP into the hole 24a of the pitch-changing substrate 24 and the hole 22b of the printed wiring board 22.

Figure 6A:
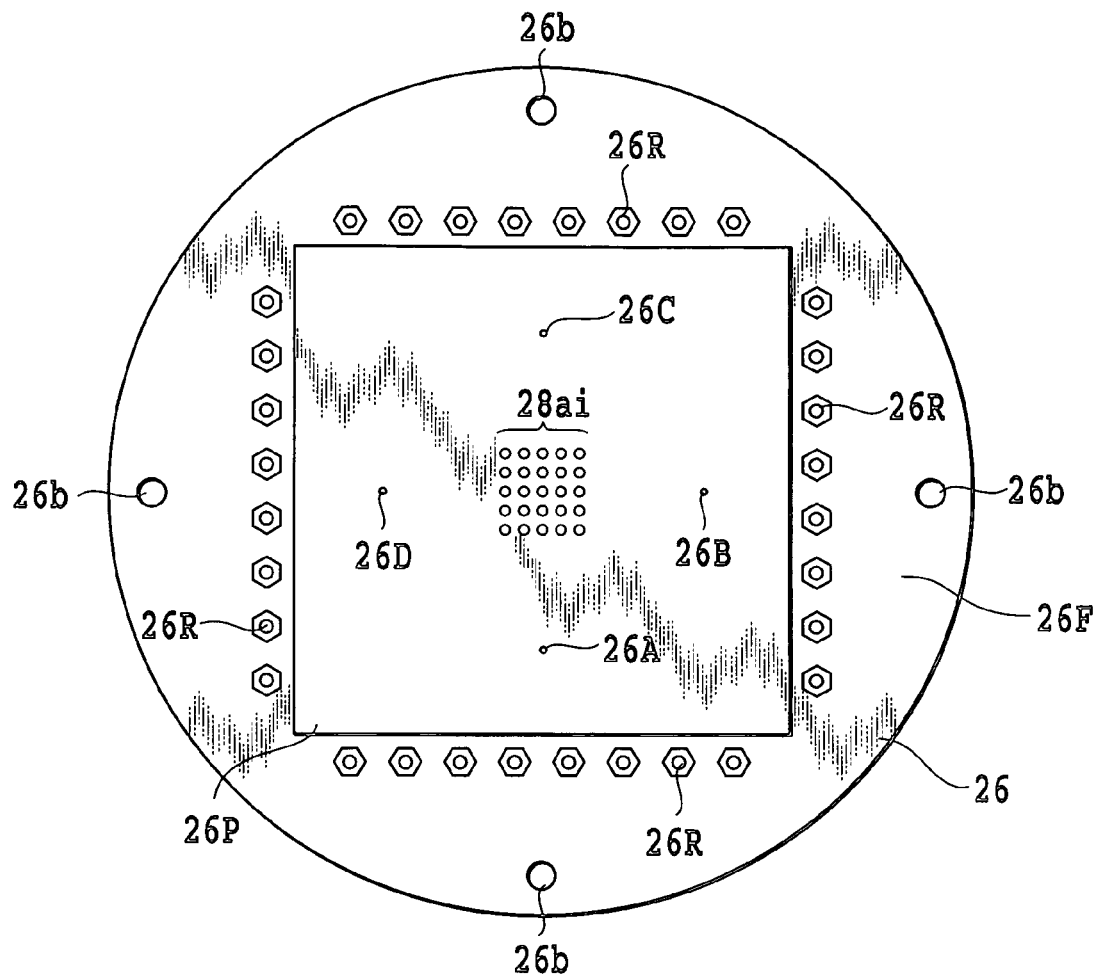
FIG. 6A is a plan view showing a contact block used in the example shown in FIG. 1.
Figure 6B:
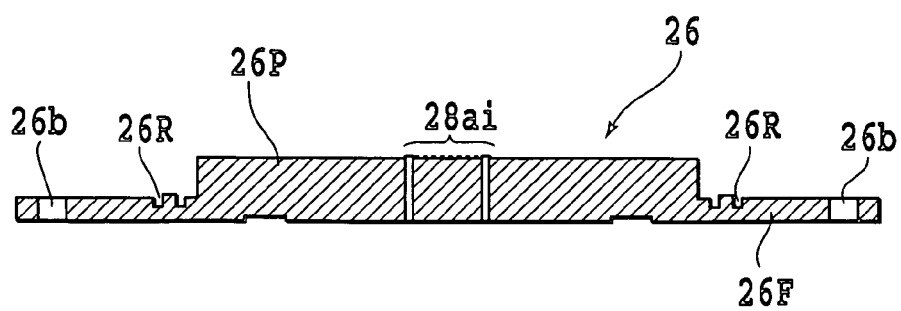
FIG. 6B is a cross-sectional view of FIG. 6A.

As shown in FIGS. 6A and 6B, the contact block 26 has a plurality of probe pins $28ai$ (i=1 to n, n is a positive integer) in a convex portion 26P generally at a center in correspondence to the electrode group 24E of the pitch-changing substrate 24.

Opposite ends of the probe pin 28ai penetrating the convex portion 26P are projected from the respective surfaces of the contact block 26 by a predetermined length. Around the group of probe pins 28ai, positioning through-holes 26A, 26B, 26C and 26D are provided at positions directly above the positioning marks 24MA, 24MB, 24MC and 24MD in the pitch-changing substrate 24 during the assembly. That is, the position of the through-holes 26A, 26B, 26C and 26D are set so that centers of the positioning marks 24MA, 24MB, 24MC and 24MD coincide with centers of the through-holes 26A, 26B, 26C and 26D in the contact block 26 placed thereon. The through-holes 26A, 26B, 26C and 26D have a diameter of approximately 0.6 mm, respectively. A diameter of the through-holes 26A, 26B, 26C and 26D may be suitably determined in accordance with the required positional accuracy.

On the outer periphery of the generally square convex portion 26P in the contact block 26, there is formed a flange portion 26F having holes 26b through which pass the positioning pins CP. A diameter of the hole 26b is slightly larger than that of the positioning pin PC for the purpose of fine adjustment described later. In the vicinity of the boundary between the convex portion 26P and the flange portion 26F in the contact block 26, a plurality of recesses 26R are formed along the respective side of the convex portion 26P, for accommodating on ends of coil springs 32. The coil springs 32 biases the contact block 26 toward the pitch-changing substrate 24. The other ends of the coil springs 32 are accommodated in recesses 30R formed on the inner side of the cover member 30.

The flange portion 26F is engaged between a recessed portion 30b in the cover member 30 and the pitch-changing substrate 24 at a predetermined gap. Also, the convex portion 26P in the contact block 26 is engaged in an opening 30a of the cover member 30 at a predetermined gap.

Thus, the probe pins 28ai in the contact block 26 are positioned at first to the electrode group 24E in the pitch-changing substrate 24 for a trial assembly by inserting the positioning pins CP into the holes 26a in the contact block 26 and the holes 24a in the pitch-changing substrate 24. Then, after the passable positioning, the fine adjustment of the contact block 26 is carried out so that all the through-holes 26A to 26D in the contact block 26 coincide with the positioning marks 24MA, 24MB, 24MC and 24MD as shown in FIG. 8C. That is, by using an optical equipment such as a microscope, the fine adjustment for the contact block 26 is carried out so that the periphery of each the through-hole 26A to 26D coincides with the corners of the positioning mark 24MA, 24MB, 24MC and 24MD. Accordingly, it is unnecessary to repeat the adjustment as in the prior art, whereby the positioning of the plurality of probe pins 28ai to the electrode group 24E in the pitch-changing substrate 24 can be easily completed.

Figure 4:
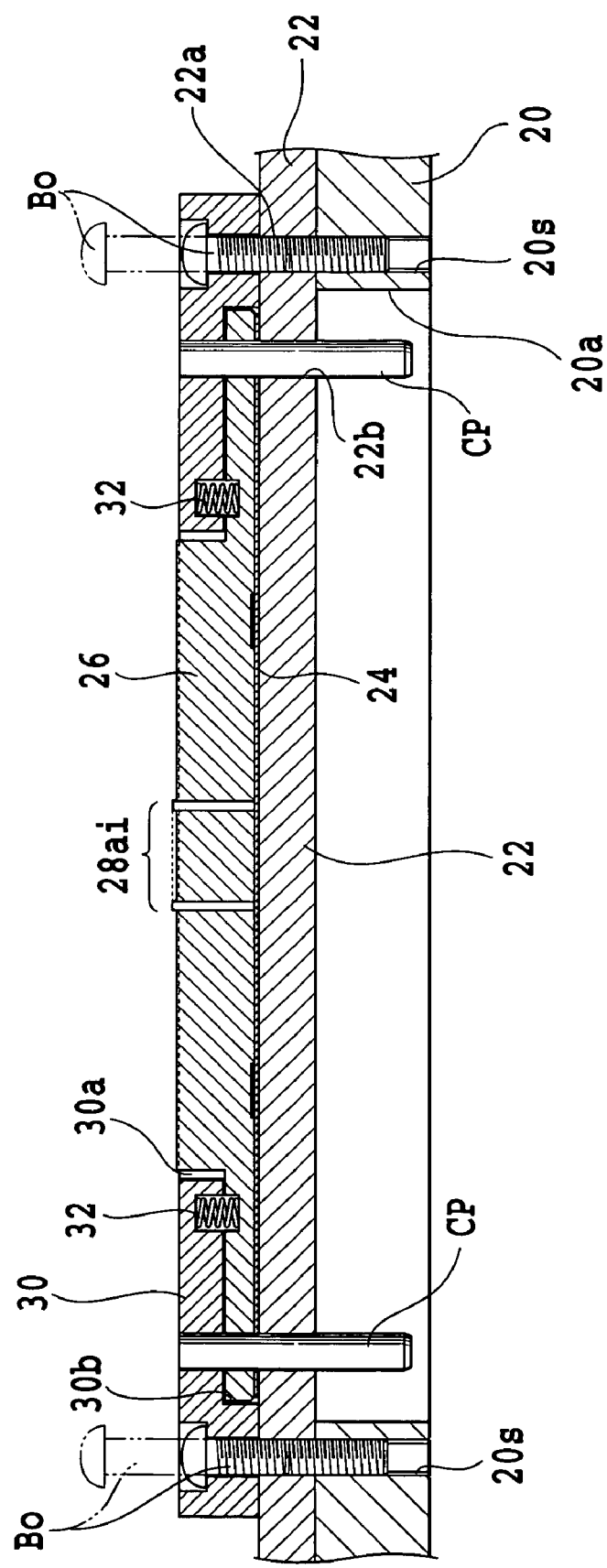
FIG. 4 is an enlarged partial cross-sectional view of part of the example shown in FIG. 1.
Figure 5:
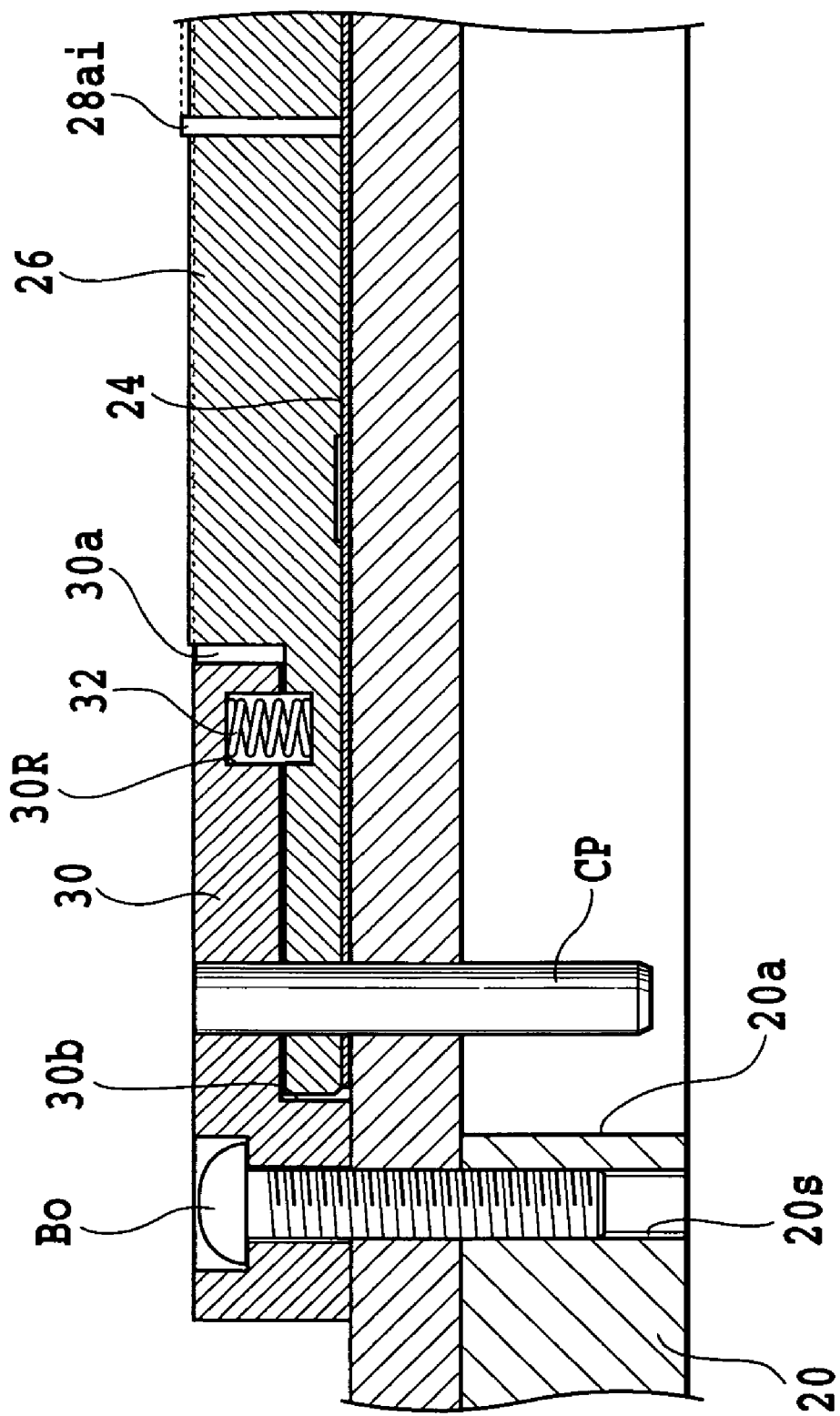
FIG. 5 is an enlarged partial cross-sectional view of part of the example shown in FIG. 1.
Figure 7A:
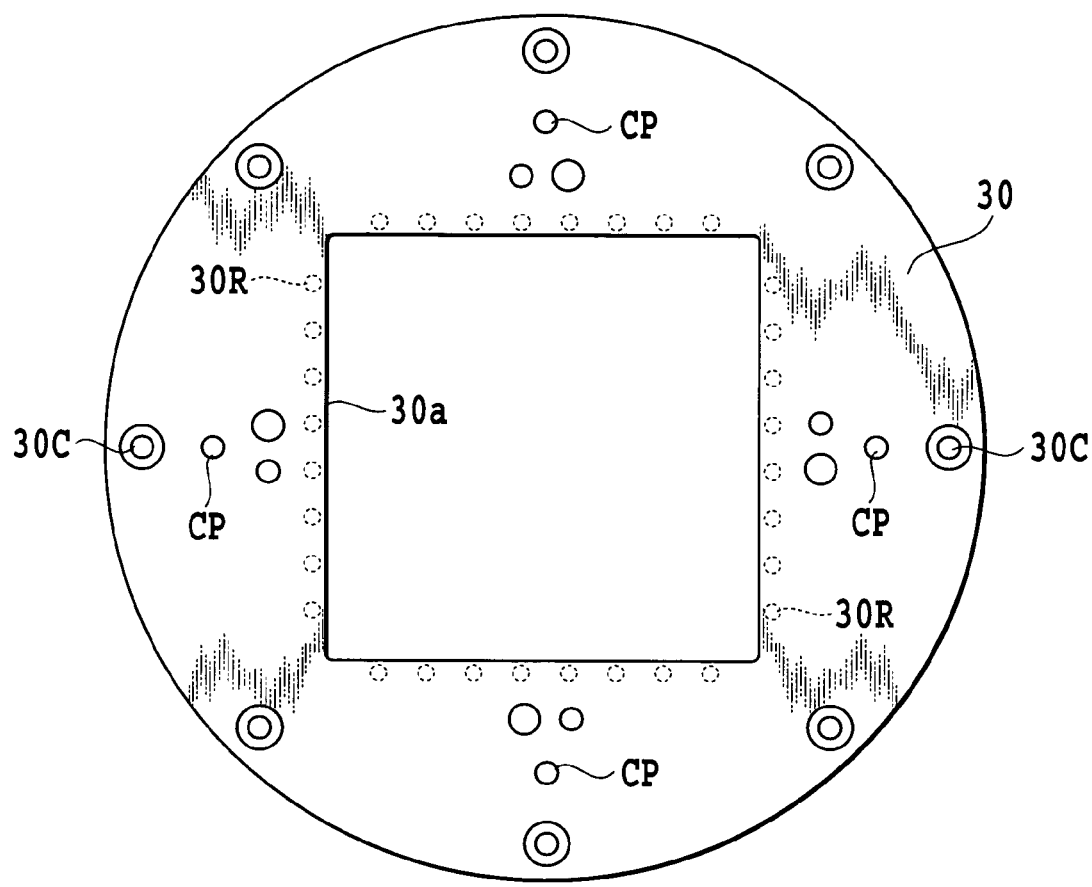
FIG. 7A is a plan view showing a cover member used in the example shown in FIG. 1.
Figure 7B:
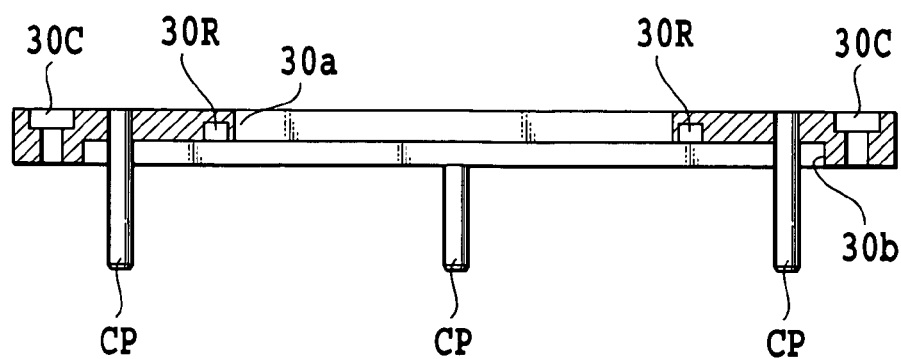
FIG. 7B is a cross-sectional view of FIG. 7A.

As shown in FIGS. 7A and 7B, the cover member 30 has a smaller opening 30a into which is inserted the convex portion 26P described above of the contact block 26 generally at a center thereof and a larger opening 30b in which is engaged the flange portion 26F of the contact block 26. The opening 30a and the opening 30b are communicated with each other. In four holes around the opening 30a, one ends of the positioning pins CP are fixed. As shown in FIGS. 4 and 5, the other ends of the positioning pins CP pass through the holes of the contact block 26, the printed wiring board 22 and the pitch-changing substrate 24 and are projected into the opening 20a of the reinforcement frame member 20. A plurality of holes 30C into which are inserted the machine screws Bo are uniformly formed on a common circumference on the outer side of the positions at which the positioning pins CP are provided.

In the vicinity of the opening 30a on the inside wall forming the opening 30b, as shown in FIG. 5, recesses 30R for accommodating the other ends of the coil springs 32 are formed opposite to the recesses 26R in the contact block 26.

When the probe head unit of such a structure is assembled, the printed wiring board 22, the pitch-changing substrate 24 and the contact block 26 are first sequentially laid on the reinforcement frame member 20. At that time, the printed wiring board 22, the pitch-changing substrate 24 and the contact block 26 are laid together so that the holes 22b, 24a and 26b coincide with each other. The coil springs 32 are mounted to the recesses 26R of the contact block 26. At that time, the pitch-changing substrate 24 and the contact block 26 are not adhered to each other, which is different from one example of the assembling method described later.

Then, the positioning pins CP of the cover member 30 are inserted into the holes 24b and 22b via the holes 26b of the contact block 26. As shown in FIG. 4 by a two-dot chain line, the machine screws Bo are temporarily threaded-engagement with the female-screw holes 20S. Thereby, the cover member 30 is disposed on the printed wiring board 22.

Subsequently, it is determined whether or not the through-holes 26A, 26B, 26C and 26D coincide with the positioning marks 24MA, 24MB, 24MC and 24MD, respectively, as shown in FIG. 8C. When the through-holes 26A to 26D coincide with the positioning marks 24MA to 24MD, respectively, the machine screws Bo are more tightly retightened to fix the cover member 30 onto the printed wiring board 22. Thus, the relative position of the probe pin 28ai to the pitch-changing substrate 24 is decided. In this regard, since the accuracy of the relative position of the electrode pad in the pitch-changing substrate 24 to the printed wiring board 22 is lower than that of the probe pin 28ai to the pitch-changing substrate 24, the positioning between the electrode pad in the pitch-changing substrate 24 and the printed wiring board 22 is sufficiently achievable by the positioning operation of the positioning pin CP.

On the other hand, if the respective through-holes 26A to 26D do not coincide with the positioning marks 26MA to 26MD, the position of the contact block 26 is finely adjusted so that the through-holes 26A to 26D in the contact block 26 coincide with the positioning marks 24MA to 24MD, respectively. And, when the through-holes 26A to 26D coincide with the positioning marks 24MA to 24MD, respectively, each of machine screws Bo are more tightly retightened to fix the cover member 30 onto the printed wiring board 22. Thus, the assembly of the probe head unit is completed.

By using the through-holes 26A to 26D and the positioning marks 24MA to 24MD as described above, it is possible to easily position the probe pins 28ai to the pitch-changing substrate 24 without necessitating much time. After the assembly, the conductive state may be confirmed by actually supplying an electric current between the plurality of probe pins 28ai and the electrode group in the pitch-changing substrate 24. Also, since the positioning marks 24MA to 24MD and the electrode group 24E are electrically connected to each other, it is possible to confirm whether or not the positioning mark 24MC is conductive to a tip end of the probe pin 28ai, for example, via the through-hole 26C.

Upon the assembly of the probe head unit, another method different from the above-mentioned one may be employed wherein the pitch-changing substrate 24 is first adhered to the contact block 26. At that time, the adhesion is carried out with the pitch-changing substrate 24 and the contact block 26 overlapping one another so that the respective through-holes in the contact block 26 coincide with the positioning marks 24MA to 24MD.

Then, the printed wiring board 22 and the adhered pitch-changing substrate 24 and the contact block 26 are sequentially laid on the reinforcement frame member 20. At that time, the printed wiring board 22 and the adhered pitch-changing substrate 24 and the contact block 26 are laid so that the holes 22b, 24a and 26b coincide with each other. In the recess 26R of the contact block 26, the coil spring 32 is mounted.

Subsequently, the positioning pin CP in the cover member 30 is inserted into the holes 24b and 22b via the hole 26b in the contact block 26. Thereby, the cover member 30 is disposed on the printed wiring board 22 and the electrode pads in the pitch-changing substrate 24 are positioned to the printed wiring board 22.

Then, each of machine screws Bo is threaded into the female-screw holes 20S of the reinforcement frame member 20 via the holes 22a of the printed wiring board 22, whereby the cover member 30 is disposed on the printed wiring board 22. Thus, the assembly of the probe head unit has been completed.

When the contact block 26 is adhered to the pitch-changing substrate 24 each other in such a manner, since the gap for the fine adjustment becomes unnecessary between the inner surfaces of the holes 26b and 24b and the outer surface of the positioning pin CP, it is possible to facilitate the fit accuracy in the holes 26b and 24b into which is inserted the positioning pin CP.

Figure 9:
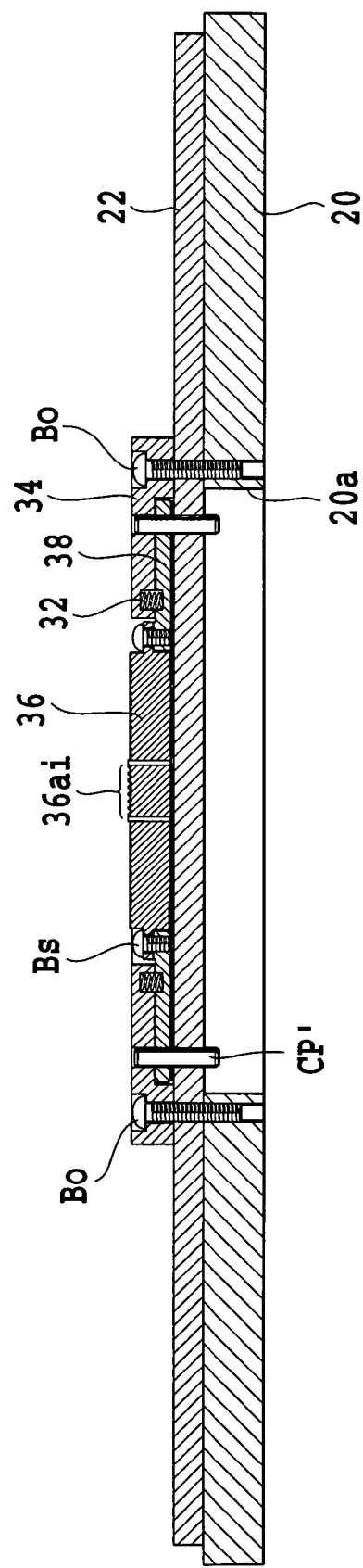
FIG. 9 is a schematic cross-sectional view of an overall structure of a probe head unit to which is applied a second embodiment of the method for assembling a testing equipment for a semiconductor substrate in accordance with the present invention.

FIG. 9 schematically illustrates an overall structure of a probe head unit to which is applied a second embodiment of the inventive method for assembling a testing equipment for a semiconductor substrate.

In the example shown in FIG. 1, the contact block 26 has the convex portion 26P and the flange portion 26F. Contrarily, in the example shown in FIG. 9, a contact block 36 has no such a flange portion, but, instead thereof, a dowel member 38 is disposed on the pitch-changing substrate 24. In this regard, in the example shown in FIG. 9 and examples shown in FIGS. 10 to 19 described later, the same reference numerals are used for denoting the same elements and the explanation thereof will be eliminated.

The contact block 36 has a plurality of probe pins 36ai (i=1 to n, n is a positive integer) generally at a center thereof in correspondence to an electrode group 24E in the pitch-changing substrate 24 described above. Opposite ends of the probe pin 36ai penetrating the center are projected from the respective surfaces of the contact block 36 at a predetermined length. Around the group of probe pins 36ai, positioning through-holes (not shown) are provided at positions directly above the positioning marks 24MA, 24MB, 24MC and 24MD in the pitch-changing substrate 24. That is, the through-holes are located so that centers of the positioning marks 24MA, 24MB, 24MC and 24MD coincide with centers of the through-holes in the contact block 36 placed thereon. The through-holes 26A, 26B, 26C and 26D have a diameter of approximately 0.6 mm. A diameter of the through-holes may be suitably determined in accordance with the required positional accuracy.

Figure 11:
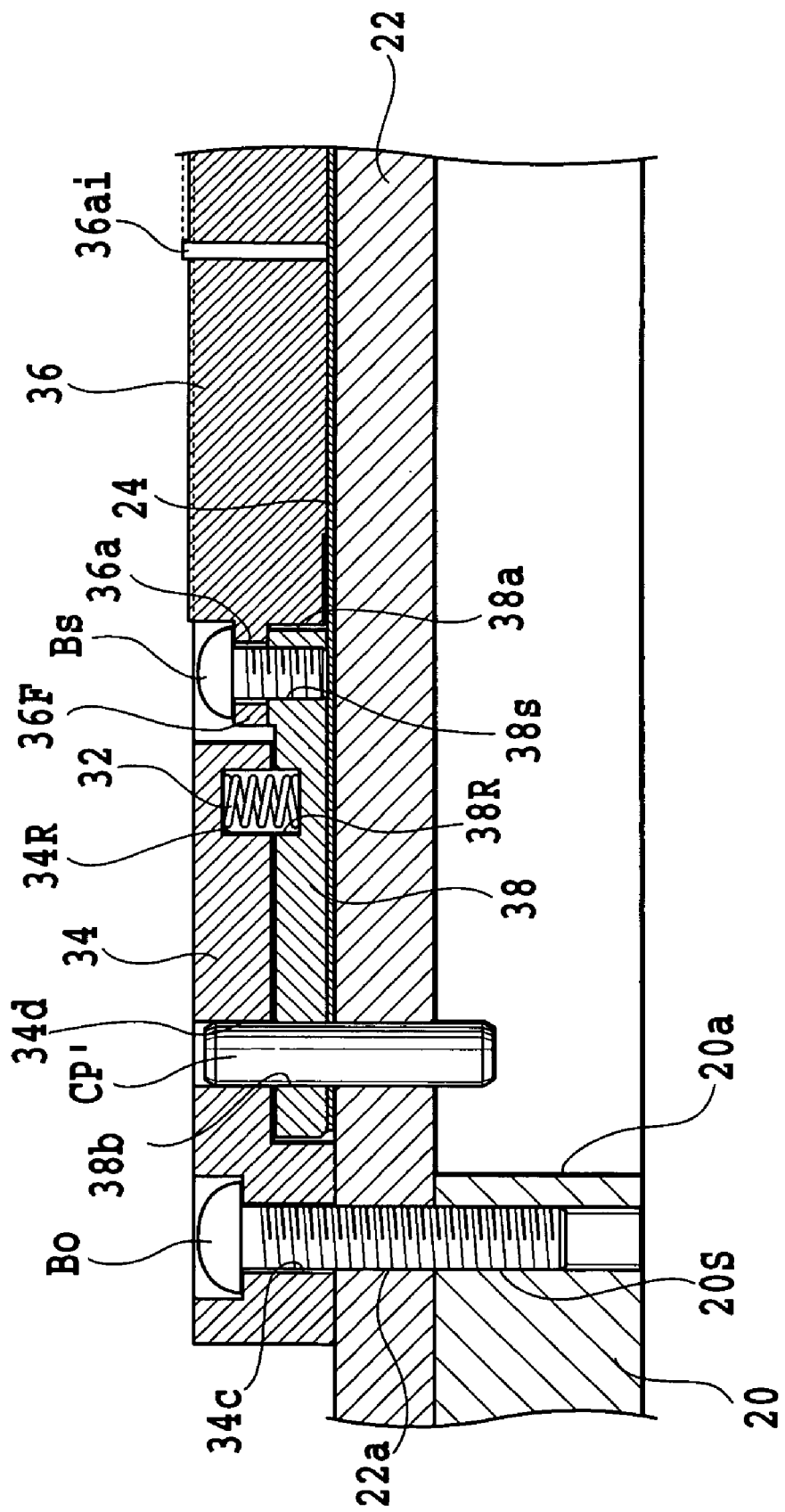
FIG. 11 is an enlarged partial cross-sectional view of part of the example shown in FIG. 9.

On the outer periphery of the generally square convex portion in the contact block 36, there is a flange portion 36F having holes 36b through which pass the machine screws Bs as shown in FIG. 11 in an enlarged manner. Directly beneath the flange portion 36F, the dowel member 38 is disposed.

The dowel member 38 has an opening 38a into which is engaged a central portion of a lower end of the contact block 36. On the periphery of the opening 38a, a plurality of female-screw holes 38S are formed, into which are thread-engaged the above-mentioned machine screws Bs. Further, in the vicinity of the outer edge of the dowel member 38, a plurality of holes 38b are formed, into which are inserted positioning pins CP' described later. A diameter of the hole 38b is slightly larger than that of the positioning pin CP'. A plurality of recesses 38R are formed between the female-screw hole 38S and the hole 38b, for accommodating one ends of the coil springs 32. The coil springs 32 bias the dowel member 38 toward the pitch-changing substrate 24. The other ends of the coil springs 32 are accommodated in recesses 34R formed in the inner wall of the cover member 34 described later.

Figure 10:
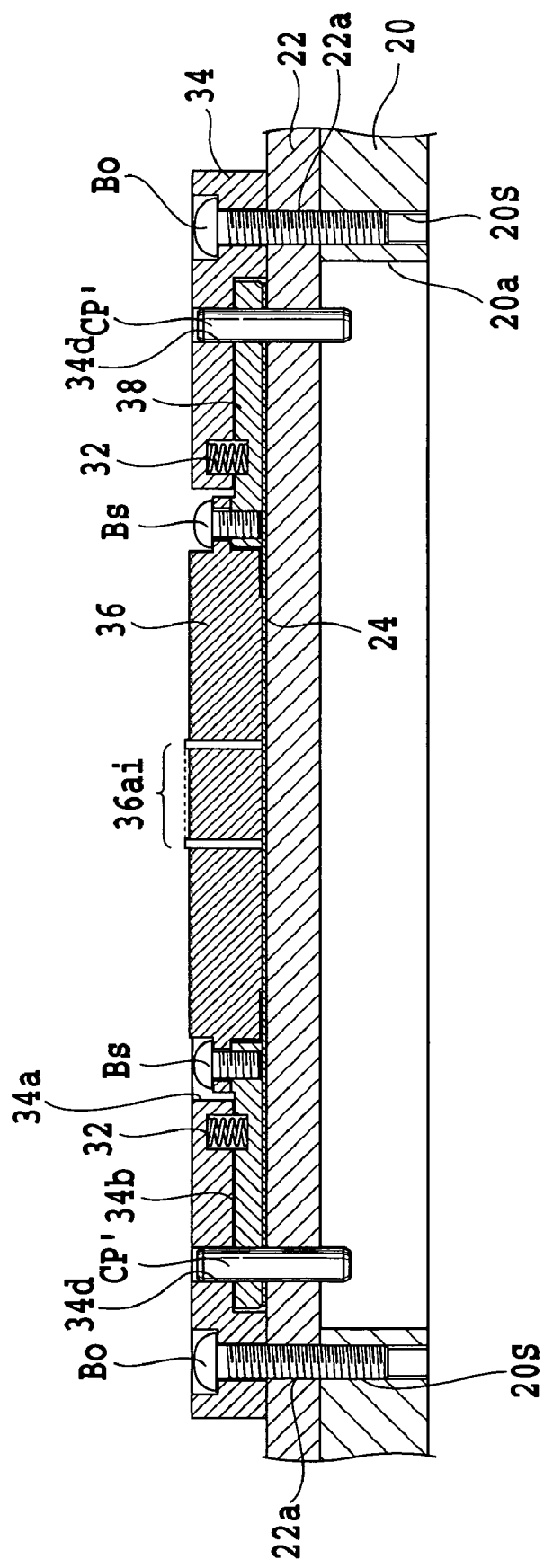
FIG. 10 is an enlarged partial cross-sectional view of part of the example shown in FIG. 9.

As shown in FIG. 10, the cover member 34 has a smaller opening 34a into which is inserted the contact block 36 described above, and a larger opening 34b with which is engaged the outer circumference of the dowel member 38 at a predetermined gap. Both the openings 34a and 34b are communicated to each other. One ends of the positioning pins CP' are fixed to four holes 34d formed around the opening 34a. As shown in FIG. 11, the other ends of the positioning pins CP' penetrate the respective holes in the contact block 36, the printed wiring board 22 and the pitch-changing substrate 24 and are projected into the central opening 20a of the reinforcement frame member 20. A plurality of holes 34C into which are inserted the machine screws Bo are uniformly formed along the circumferential direction at positions outside of the positions at which the positioning pins CP' are provided.

As shown in FIG. 11, in the inner wall of the larger opening 34b in the vicinity of the smaller opening 34a, a recess 34R for accommodating the other end of the coil spring 32 is formed opposite to the recess 38R in the dowel member 38.

In this structure, when the probe head unit is assembled, first, the printed wiring board 22 and the pitch-changing substrate 24 are sequentially laid on the reinforcement frame member 20, and then the contact block 36 preliminarily coupled with the dowel member 38 by the machine screws Bs is laid thereon. At that time, the printed wiring board 22, the pitch-changing substrate 24, the contact block 36 and the dowel member 38 are laid so that the holes 22b, 24a and 38b coincide with each other. The pitch-changing substrate 24 and the dowel member 38 are not adhered together, which is different from an example described later.

Next, the positioning pins CP' in the cover member 34 are inserted into the holes 24b and 22b through the holes 38b of the dowel member 38. Also, the machine screws Bo are fixed to the female-screw holes 20S in the reinforcement frame member 20 via the holes 34C in the cover member 34 and the holes 22a in the printed wiring board 22. Thus, the cover member 34 is disposed on the printed wiring board 22.

In this regard, since the accuracy of the relative position between the electrode pad in the pitch-changing substrate 24 and the printed wiring board 22 is lower than the accuracy of the relative position between the probe pin 36ai and the pitch-changing substrate 24, the positioning of the electrode pad in the pitch-changing substrate 24 relative to the printed wiring board 22 is satisfactorily achievable by the positioning due to the positioning pins CP'.

Subsequently, it is determined whether or not the respective through-holes in the contact block 36 coincide with the positioning marks 24MA, 24MB, 24MC and 24MD. If the answer is affirmative, the machine screws Bs are retightened to fix the contact block 36 to the dowel member 38. Thus, the relative position of the probe pin 36ai to the pitch-changing substrate 24 is satisfactory.

By providing the fine adjustment gap between the inner wall of the hole 36a and the outer circumference of the machine screw Bs when the contact block 36 is fixed via the dowel member 38, it is unnecessary to provide the fine adjustment gap between the inner walls of the holes 38b and 24a and the outer circumference of the positioning pin CP', whereby it is possible to further improve the engagement accuracy of the holes 38b and 24a with the positioning pin CP'.

Contrarily, if the answer is negative, the fine adjustment of the contact block 36 is carried out so that the respective through-holes in the contact block 36 coincide with the positioning marks 24MA to 24MD. After the fine adjustment has been completed, the machine screws Bs are retightened to fix the cover member 34 onto the printed wiring board 22. Thus, the assembly of the probe head unit has been completed. By using the respective through-holes and the positioning marks 24MA to 24MD in such a manner, it is possible to easily position the probe pins 36ai to the pitch-changing substrate 24 without needing much time. In this regard, the conductive state between the plurality of probe pins 36ai and the electrode group in the pitch-changing substrate 24 may be confirmed by actually sending the electric current between the both.

Upon the replacement of the probe pins 36ai, it is possible to replace them together with the contact block 36 by removing the machine screws Bs, without taking off the cover member 34. At that time, the adjustment of the relative position between the probe pins 36ai in the contact block 36 and the pitch-changing substrate 24 can be carried out in the same way as described above. Further, in the above structure, when the probe head unit is assembled wherein the pitch-changing substrate 24 is adhered to the dowel member 38, the pitch-changing substrate 24 is first adhered to the dowel member 38. At that time, the pitch-changing substrate 24 is laid on the dowel member 38 so that the holes 24a in the former coincide with the holes 38b in the latter.

Then, the contact block 36 is laid on the dowel member 38 and temporarily fixed thereto by the machine screws Bs.

Subsequently, it is determined whether or not the respective through-holes in the contact block 36 coincide with the positioning marks 24MA, 24MB, 24MC and 24MD. If the answer is affirmative, the machine screws Bs are retightened to completely fix the contact block 36 to the dowel member 38. Thus, the probe pin 36ai is positioned to the pitch-changing substrate 24.

On the other hand, if the answer is negative, the fine adjustment of the contact block 36 is carried out so that the respective through-holes in the contact block 36 coincide with the positioning marks 24MA to 24MD. After the fine adjustment, machine screws Bs are retightened. Thus, the dowel member 38 and the pitch-changing substrate 24 are assembled to the contact block 36.

Then, the contact block 36 to which the dowel member 38 and the pitch-changing substrate 24 are assembled is laid on the printed wiring board 22 placed on the reinforcement frame member 20. Thereafter, the cover member 34 is laid on the dowel member 38. At that time, the positioning pins CP' are inserted into the holes 38b and 22b, and the machine screws Bo are thread-engaged with the female-screw holes 20S in the reinforcement frame member 20 via the holes 34C in the cover member 34 and the holes 22a in the printed wiring board 22.

When the dowel member 38 and the pitch-changing substrate 24 are adhered to each other in such a manner, the positional relationship between the contact block 36 and the pitch-changing substrate 24 is maintained by the fastening of the machine screws Bs, whereby even if a shock is applied to the probe head unit due to the transportation or others, there is no risk in that the contact block 36 is shifted to the pitch-changing substrate 24.

The cover member 34 is disposed on the printed wiring board 22. Thus, the assembly of the probe head unit has been completed.

Figure 12:
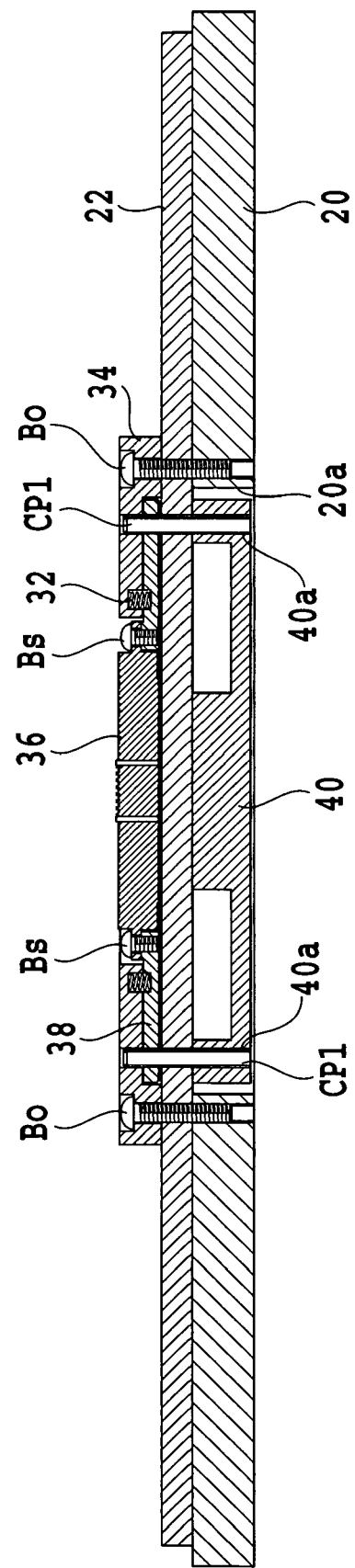
FIG. 12 is a schematic cross-sectional view of an overall structure of a probe head unit to which is applied a third embodiment of the method for assembling a testing equipment for a semiconductor substrate in accordance with the present invention.
Figure 13:
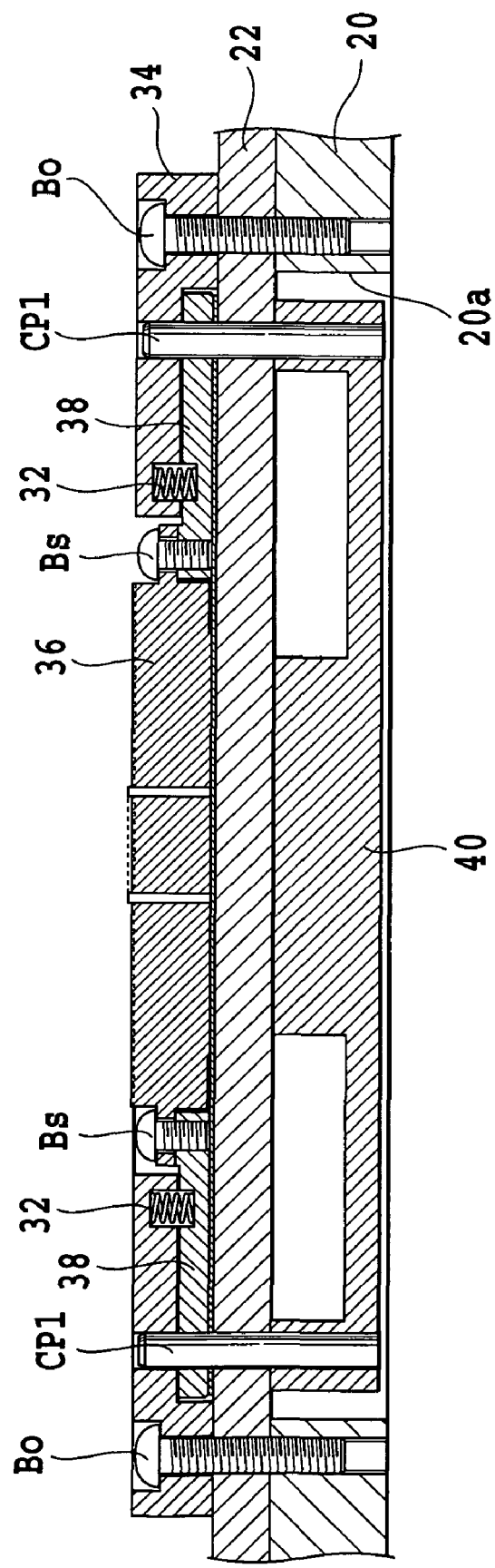
FIG. 13 is an enlarged partial cross-sectional view of part of the example shown in FIG. 12.
Figure 14:
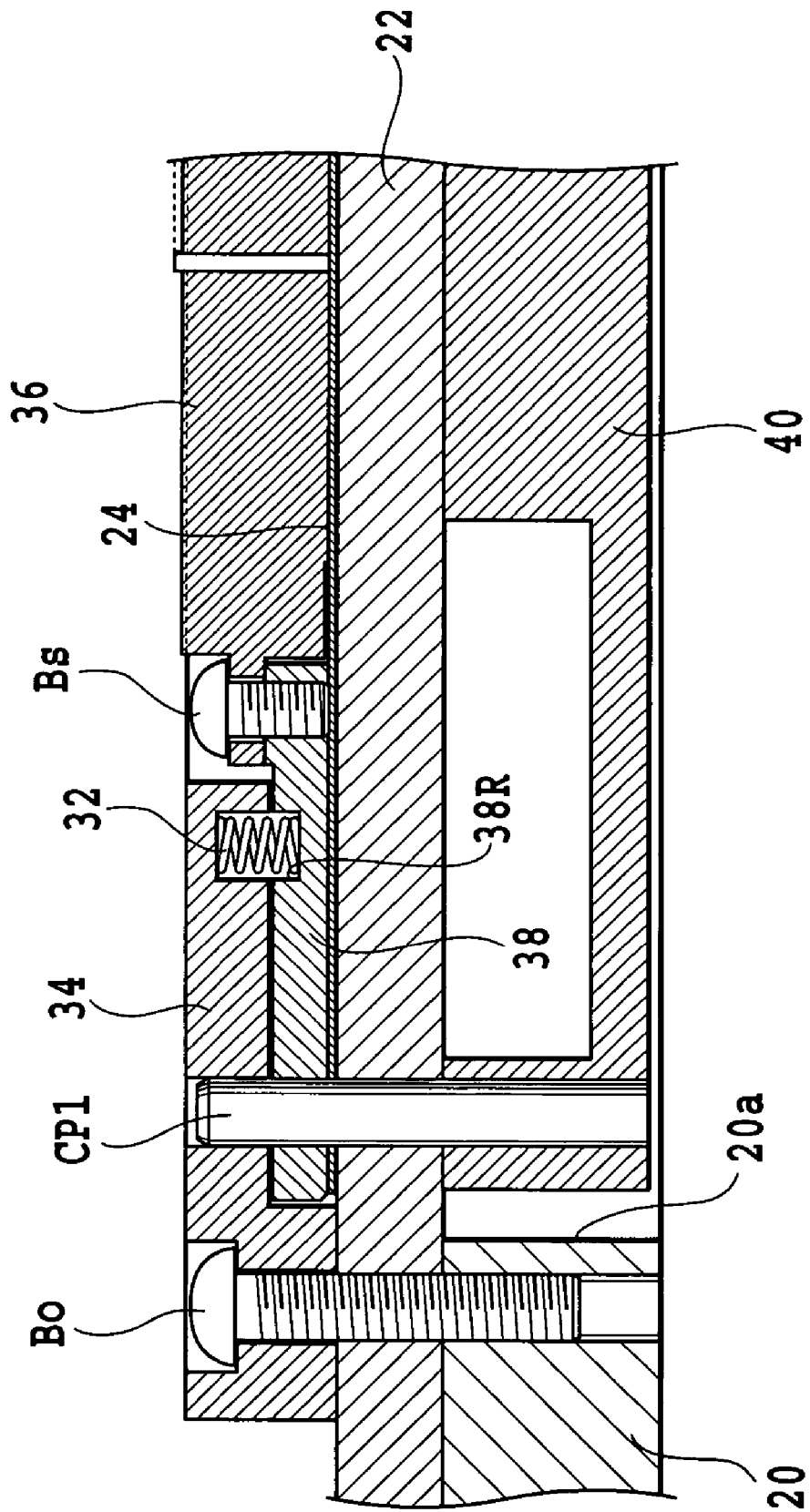
FIG. 14 is an enlarged partial cross-sectional view of part of the example shown in FIG. 12.

FIG. 12 schematically illustrates an overall structure of a probe head unit to which is applied a third embodiment of the inventive method for assembling a testing equipment for a semiconductor substrate.

In the example shown in FIG. 9, the opening 20a in the reinforcement frame member 20 is a vacant space. Contrarily, in the example shown in FIG. 12, a second reinforcement frame member 40 is disposed in this space in accordance with the rigidity of the printed wiring board 22. In this regard, in FIGS. 12 to 15, the same reference numerals are used for denoting the same elements as in FIG. 9, and the explanation thereof will be eliminated.

The reinforcement frame member 40 has holes 40a at positions directly beneath the respective holes 22b in the printed wiring board 22, into which are inserted one ends of the respective positioning pins CP1. Thus, the one ends of the positioning pins CP1 are inserted into the holes 40a to further increase the rigidity of the printed wiring board 22.

Figure 15:
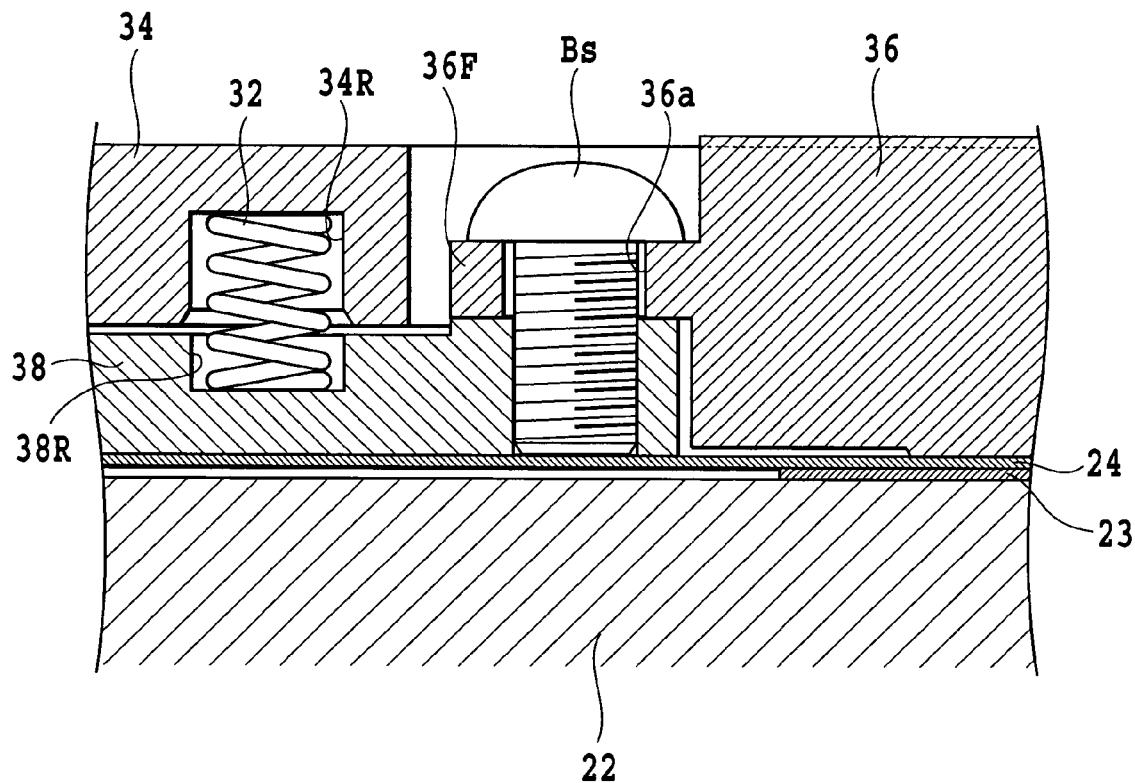
FIG. 15 is an enlarged partial cross-sectional view of part of the example shown in FIG. 12.

In this regard, as shown in FIG. 15, an anisotropic conductive sheet 23 may be provided between the pitch-changing substrate 24 and the printed wiring board 22.

Figure 16:
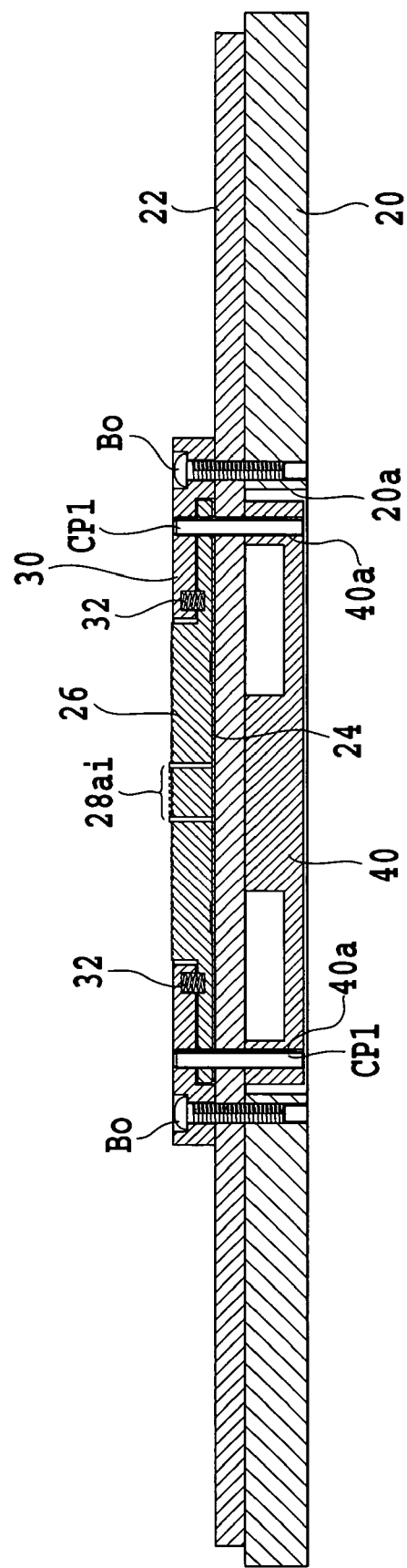
FIG. 16 is a schematic cross-sectional view of an overall structure of a probe head unit to which is applied a fourth embodiment of the method for assembling a testing equipment for a semiconductor substrate in accordance with the present invention.
Figure 17:
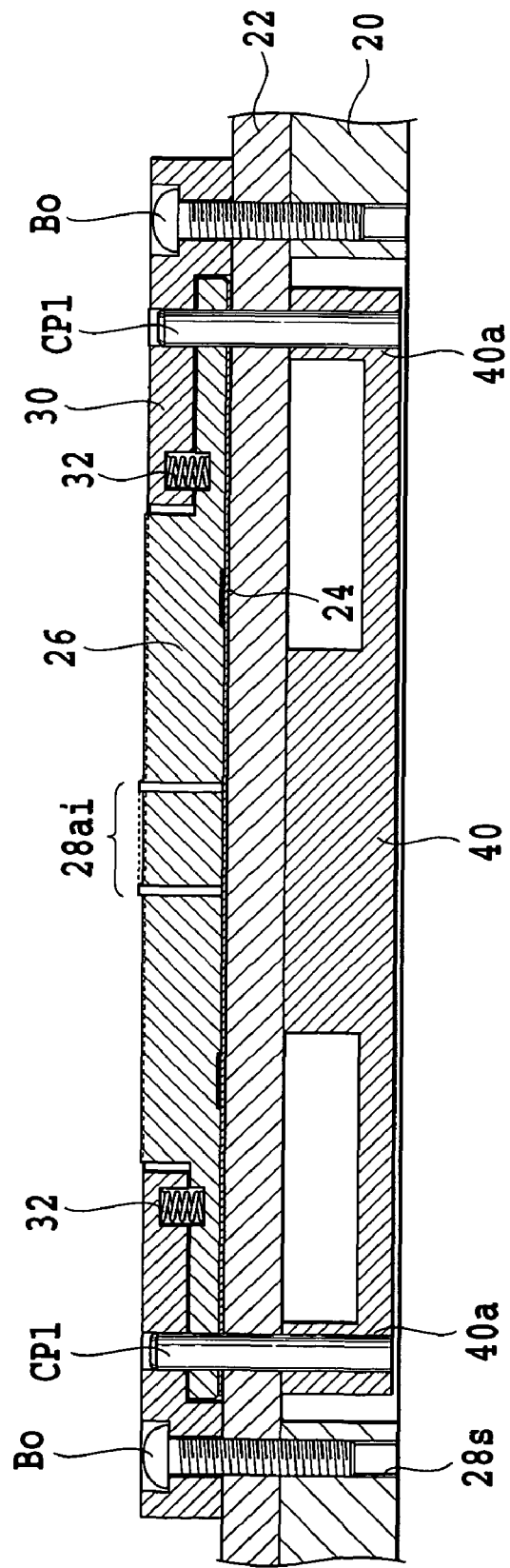
FIG. 17 is an enlarged partial cross-sectional view of part of the example shown in FIG. 16.
Figure 18:
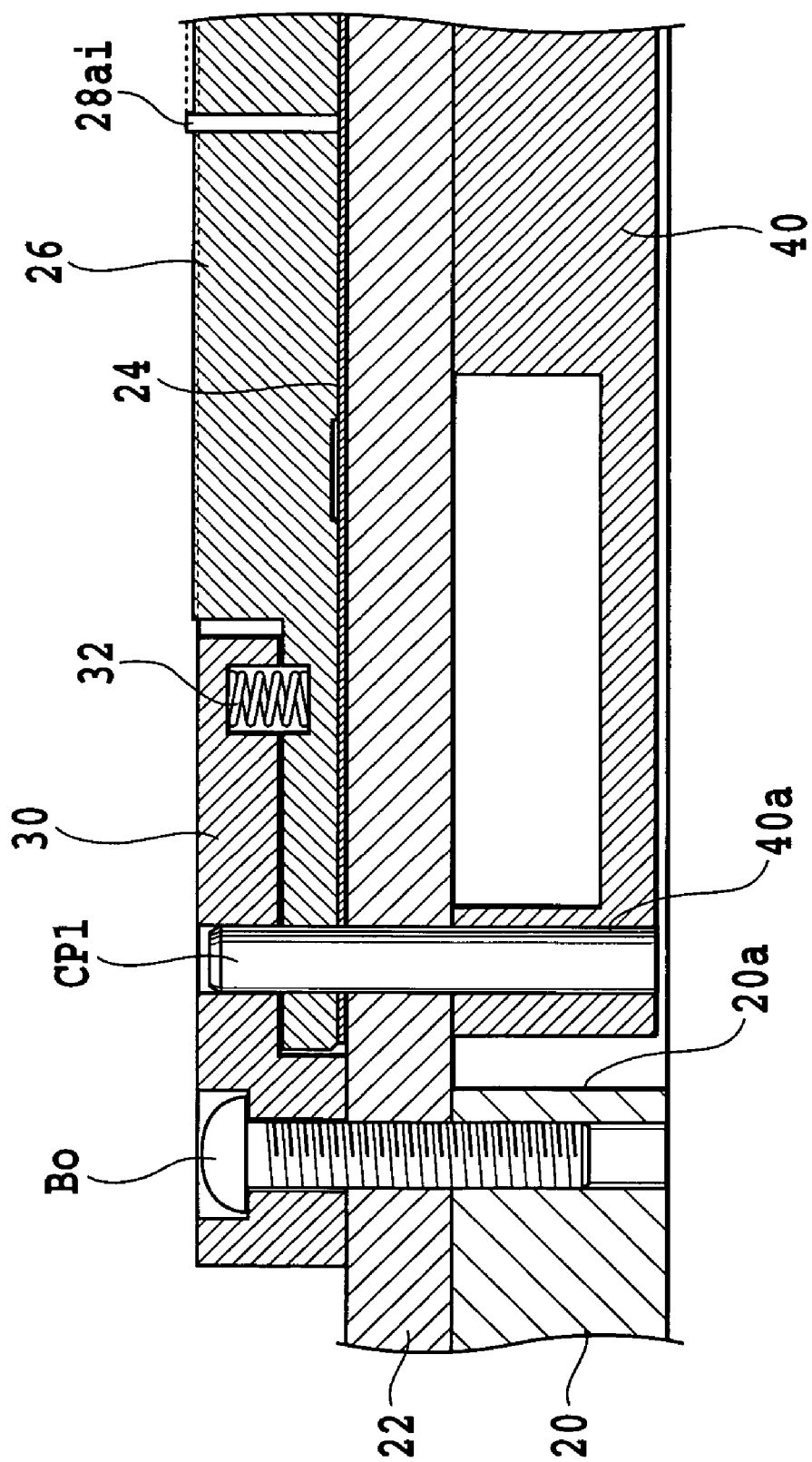
FIG. 18 is an enlarged partial cross-sectional view of part of the example shown in FIG. 16.

FIG. 16 schematically illustrates an overall structure of a probe head unit to which is applied a fourth embodiment of the inventive method for assembling a testing equipment for a semiconductor substrate.

In the example shown in FIG. 9, the opening 20a in the reinforcement frame member 20 is a vacant space. Contrarily, in the example shown in FIG. 16, a second reinforcement frame member 40 is disposed in this space in accordance with the rigidity of the printed wiring board 22. In this regard, in FIGS. 16 to 19, the same reference numerals are used for denoting the same elements as in FIG. 9, and the explanation thereof will be eliminated.

Also in this embodiment, the reinforcement frame member 40 has holes 40a at positions directly beneath the respective holes 22b in the printed wiring board 22, into which are inserted one ends of the respective positioning pins CP1. Thus, the one ends of the positioning pins CP1 are inserted into the holes 40a to further increase the rigidity of the printed wiring board 22. While the positioning pins are provided in the cover member 30 or 34 in the above-mentioned example, it is not limitative but the positioning pins may be provided in the reinforcement frame member 40 and the contact block 26.

Figure 19:
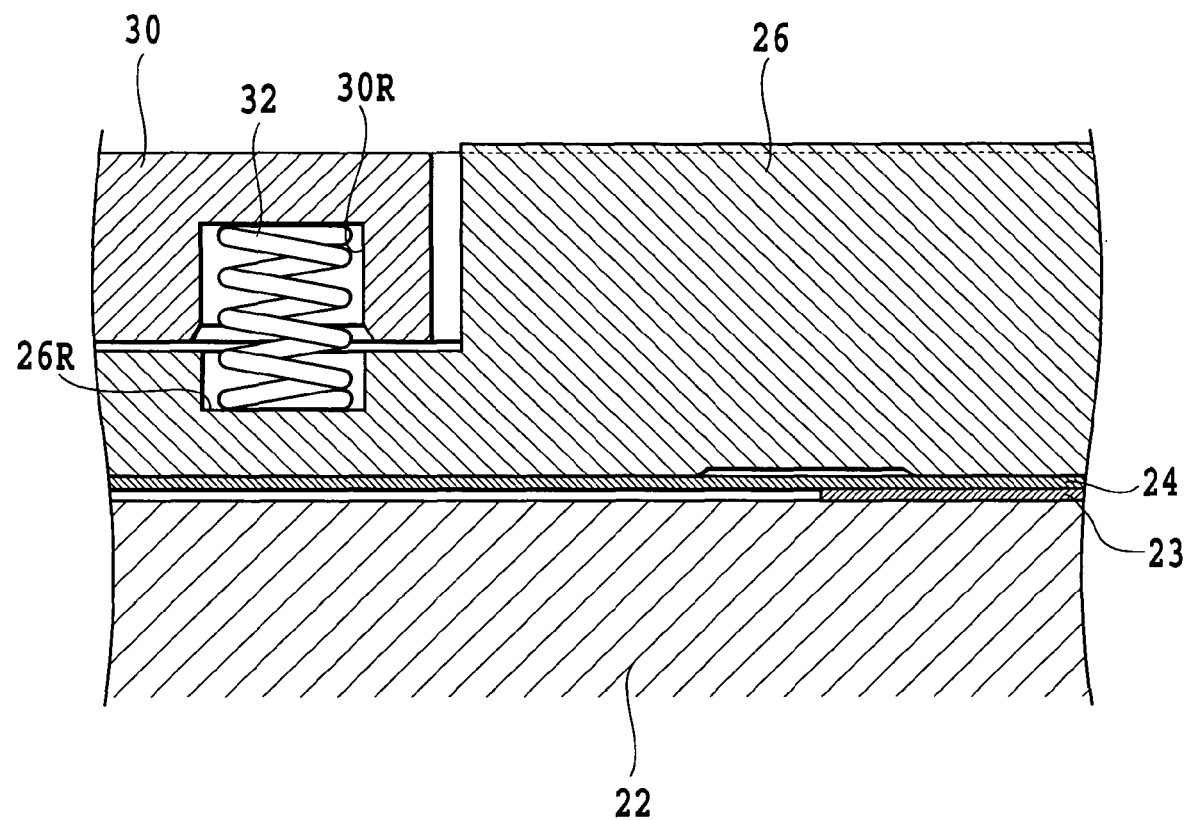
FIG. 19 is an enlarged partial cross-sectional view of part of the example shown in FIG. 16.
Figure 20:
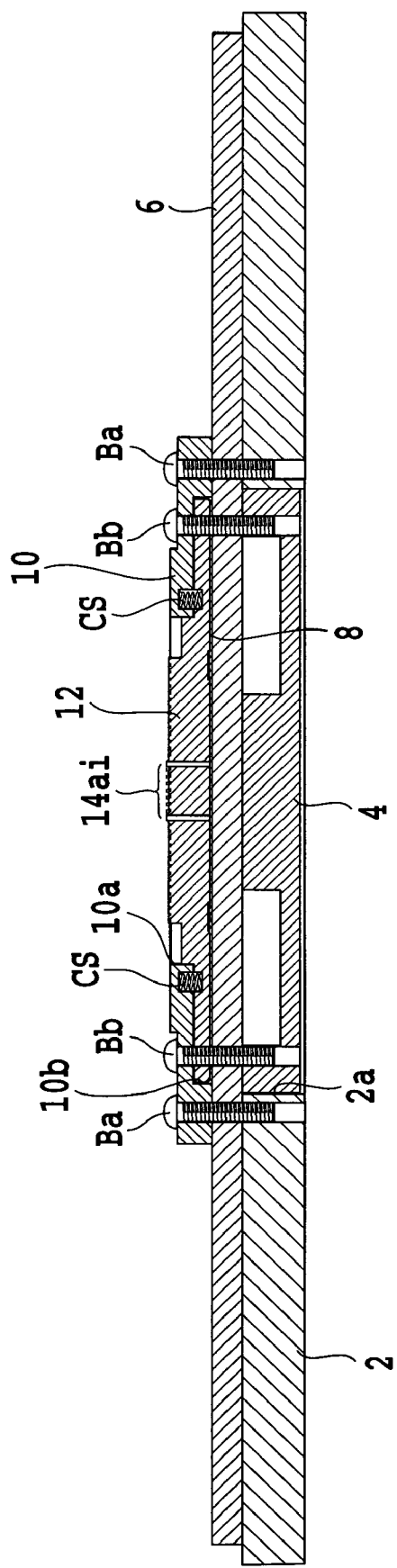
FIG. 20 is a schematic cross-sectional view of an overall structure of a prior art probe head unit.

In this regard, as shown in FIG. 19, the anisotropic conductive sheet 23 may be disposed between the pitch-changing substrate 24 and the printed wiring board 22.

The present invention has been described in detail with respect to preferred embodiments, and it will now be apparent from the foregoing to those skilled in the art that changes and modifications may be made without departing from the invention in its broader aspect, and it is the intention, therefore, in the apparent claims to cover all such changes.

What is claimed is:

1. A method for assembling testing equipment for a semiconductor substrate comprising the steps of:
overlaying a contact block on a dowel member and changing substrate, wherein said contact block is adjustable relative to said dowel member by the provision of a gap between the contact block and a screw that fixes the contact block and the dowel member and said contact block having a group of connection terminals to be electrically connected to circuit patterns in a semiconductor substrate and further having a mark detection hole having a predetermined positional relationship to said connection terminal group, said changing substrate having a group of electrodes to be electrically connected to said connection terminal group;

making a positioning mark formed in said changing substrate to coincide with said mark detection hole by sighting through said mark detection hole and adjusting said contact block relative to said dowel member by the provision of the gap between the contact block and the screw, said positioning mark being formed in correspondence to said mark detection hole in said disposed contact block to have a predetermined positional relationship to the position of said electrode group; and coupling said contact block and said changing substrate so that said positioning mark and said mark detection hole coincide with each other and to a printed wiring board for supplying test signals to said electrode.

2. A method for assembling a testing equipment for a semiconductor substrate, as claimed in claim 1, wherein when said contact block and said changing substrate which said positioning mark and mark detection hole coincide with each other are coupled to said printed wiring board for supplying test signals to said electrode group, a common positional pin is inserted into a positioning hole for restricting the relative position between said contact block, said changing substrate and said printed wiring board.

3. A method for assembling a testing equipment for a semiconductor substrate, as claimed in claim 1, wherein when said positioning mark in said changing substrate is made to coincide with said mark detection hole in said contact block, said changing substrate and said contact block are adhered to each other.

4. A method for assembling a testing equipment for a semiconductor substrate comprising the steps of:

disposing a group of connection terminals to be electrically connected to circuit patterns in a semiconductor substrate, a pitch-changing substrate having a group of electrodes to be electrically connected to said connection terminal group, and a dowel member arranged on said pitch-changing substrate on a printed wiring board, the printed wiring board being configured for supplying test signals to said electrode group via said pitch-changing substrate;

coupling said changing substrate to said printed wiring board;

overlaying, on said dowel member, a contact block having a mark detection hole having a predetermined positional relationship to positions of said group of connection terminals;

making a positioning mark in said pitch-changing substrate to coincide with said mark detection hole in said contact block by sighting through said mark detection hole, said positioning mark being formed in correspondence to said mark detection hole in said disposed contact block to have a predetermined positional relationship to a position of said electrode group; and coupling said contact block to said dowel member.

5. A method for assembling a testing equipment for a semiconductor substrate, as claimed in claim 4, wherein when said pitch-changing substrate is coupled to said printed wiring board, a common positioning pin is inserted into a positioning hole for restricting the relative position between said changing substrate and said printed wiring board.

6. A method for assembling a testing equipment for a semiconductor substrate, as claimed in claim 4, wherein said dowel member disposed on said changing substrate is adhered to said changing substrate.

7. A method for assembling testing equipment for a semiconductor substrate comprising the steps of:

overlaying, with each other, a group of connection terminals to be electrically connected to circuit patterns in a semiconductor substrate, a pitch-changing substrate having an electrode group to be electrically connected to said connection terminal group, a dowel member disposed on said pitch-changing substrate, and a contact block on said dowel member, wherein said contact block is adjustable relative to said dowel member by the provision of a gap between the contact block and a screw that fixes the contact block and the dowel member and said contact block having a mark detection hole configured to be in a predetermined positional relationship to a position of said connection terminal group, making said positioning mark in said pitch-changing substrate to coincide with said mark detection hole by sighting through said mark detection hole and adjusting said contact block relative to said dowel member by the provision of the gap between the contact block and the screw, said positioning mark being formed in correspondence to said mark detection hole in said disposed contact block to have a predetermined positional relationship to the position of said electrode group;

coupling said contact block to said dowel member;

disposing said contact block and said pitch-changing substrate so that said positioning mark and said mark detection hole coincide with each other on a printed wiring board, the printed wiring board being configured for supplying test signals to said electrode group; and coupling said contact block and changing substrate to said printed wiring board.

8. A method for assembling testing equipment for a semiconductor substrate, as claimed in claim 7, wherein when said contact block and changing substrate which said positioning mark and said mark detection hole coincide with each other are disposed on said printed wiring board, a common positional pin is inserted into a positioning hole for restricting the relative position between said changing substrate, said contact block, and said printed wiring board.

9. A method for assembling testing equipment for a semiconductor substrate, as claimed in claim 7, wherein said dowel member disposed on said changing substrate is adhered to said changing substrate.

10. A method for assembling testing equipment for a semiconductor substrate, as claimed in claim 7, wherein when said contact block is coupled to said dowel member, said contact block is coupled to said dowel member by screws inserted into screw holes formed in said dowel member and said contact block.

* * * * *